(12) United States Patent
Derksen

(10) Patent No.: US 7,170,584 B2
(45) Date of Patent: Jan. 30, 2007

(54) LITHOGRAPHIC APPARATUS AND DEVICE MANUFACTURING METHOD

(75) Inventor: Antonius Theodorus Anna Maria Derksen, Eindhoven (NL)

(73) Assignee: ASML Netherlands B.V. (NL)

( * ) Notice: Subject to any disclaimer, the term of this patent is extended or adjusted under 35 U.S.C. 154(b) by 253 days.

(21) Appl. No.: 10/990,317

(22) Filed: Nov. 17, 2004

(65) Prior Publication Data

US 2006/0103827 A1    May 18, 2006

(51) Int. Cl.
  *G03B 27/54* (2006.01)
(52) U.S. Cl. .............................. 355/67; 355/69; 355/71
(58) Field of Classification Search ...................... None
  See application file for complete search history.

(56) References Cited

U.S. PATENT DOCUMENTS

| | | | |
|---|---|---|---|
| 5,229,872 A | 7/1993 | Mumola | |
| 5,253,237 A * | 10/1993 | Miyake et al. | 369/44.37 |
| 5,296,891 A | 3/1994 | Vogt et al. | |
| 5,418,599 A * | 5/1995 | Kamon | 355/77 |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2001/0045690 A1* | 11/2001 | Brandinger | 264/400 |
| 2004/0037462 A1* | 2/2004 | Lewis et al. | 382/181 |
| 2004/0041104 A1 | 3/2004 | Liebregts et al. | |
| 2004/0130561 A1 | 7/2004 | Jain | |
| 2005/0007572 A1 | 1/2005 | George et al. | |
| 2005/0057757 A1* | 3/2005 | Colonna De Lega et al. | 356/497 |
| 2005/0286035 A1* | 12/2005 | Troost et al. | 355/67 |

FOREIGN PATENT DOCUMENTS

| | | |
|---|---|---|
| WO | WO 98/33096 | 7/1998 |
| WO | WO 98/38597 | 9/1998 |

\* cited by examiner

*Primary Examiner*—D. Rutledge
(74) *Attorney, Agent, or Firm*—Sterne, Kessler, Goldstein & Fox PLLC

(57) ABSTRACT

In a maskless lithography apparatus light deflected by a patterning array out of a path towards a substrate is directed onto a detector that detects malfunctions of the patterning array. If the patterning array is of a type which selectively diverts radiation in order to pattern the beam, the detector can use the radiation that is diverted out of the beam. Alternatively, a second beam of radiation, additional to the exposure radiation, can be provided.

21 Claims, 3 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means can comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or antiparallel to this direction.

In a maskless lithography apparatus, in which the conventional mask or reticle is replaced by a programmable patterning device (also known as a contrast device), there is always the possibility that the programmable device, or its control electronics, will malfunction. For example, a pixel of the device can be stuck in "on" or "off" states and a device having multiple, or a continuum of, gray levels can not adopt the correct level.

Therefore, what is needed is a lithography system and method in which malfunctions of programmable patterning device 104 can be detected.

SUMMARY OF THE INVENTION

According to an embodiment of the invention, there is provided a lithographic apparatus for projecting a pattern onto a substrate. The apparatus comprises a patterning array of individually controllable elements serving to impart a beam with a desired pattern by selectively diverting incident radiation between a first optical path leading to a target portion of the substrate and a second optical path not leading to the substrate. The apparatus also comprises a detector sensitive to the radiation provided in the second optical path.

According to another embodiment of the invention, there is provided a lithographic apparatus for projecting a pattern onto a substrate. The apparatus comprises a patterning array, first and second illumination systems, a projection system, and a detector. The patterning array is comprised of individually controllable elements. The first illumination system directs a first beam of radiation onto the patterning array. The patterning array patterns the first beam. The second illumination system directs a second beam of radiation onto the patterning array from a different direction. The patterning array imparts the second beam with a second pattern that is a complement of the first pattern. The projection system projects the first beam onto a target portion of the substrate. Detector 242 is positioned to receive, and is sensitive to, radiation from the second beam deflected by the patterning array.

According to another embodiment of the invention, there is provided a device manufacturing method comprising the following steps. Using a patterning array of individually controllable elements to impart a beam of radiation with a pattern by selectively diverting incident radiation between a first optical path leading to a target portion of the substrate and a second optical path not leading to the substrate. Using a detector provided in the second optical path to detect any malfunction of the patterning array.

According to another embodiment of the invention, there is provided a device manufacturing method comprising the following steps. Directing first and second beams of radiation onto a patterning array of individually controllable elements that pattern the beams. Directing the beams onto the patterning array from different directions, such that they are patterned with complementary patterns. Projecting the first beam of radiation onto a target portion of a substrate. Using a detector provided in the path of the second beam to detect any malfunction of the patterning array.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers can indicate identical or functionally similar elements.

DETAILED DESCRIPTION OF THE EMBODIMENTS

Overview and Terminology

Figure 1:
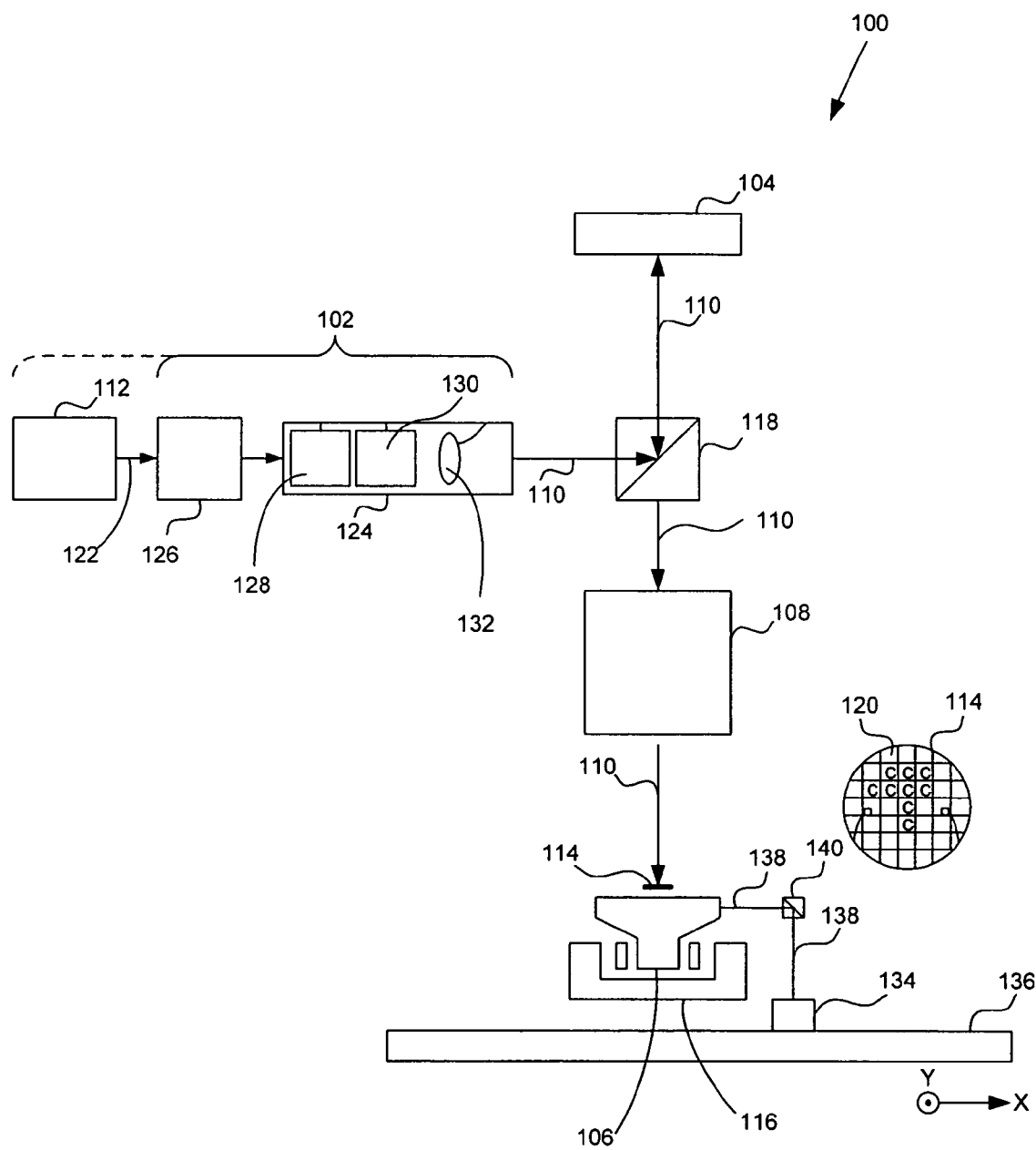
FIG. 1 depicts a lithographic apparatus, according to one embodiment of the present invention.

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g., having a wavelength in the range of 5–20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Lithographic Projection Apparatus

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and substrate table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use can also be employed.

Exemplary Operating Principles

Figure 2:
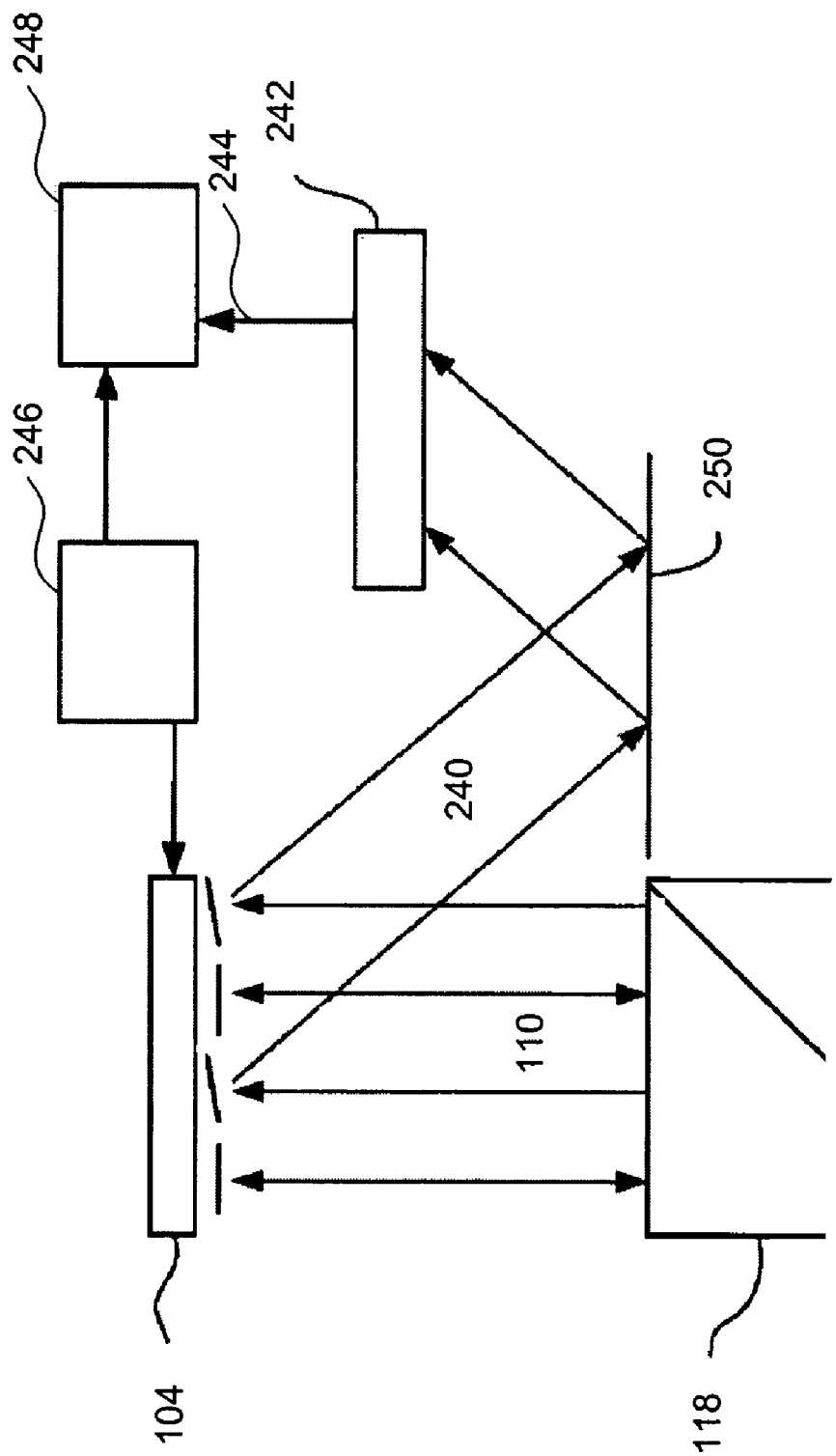
FIGS. 2–3 illustrate principles of operation, according to various embodiments of the present invention.

FIG. 2 illustrates an operating principle, according to one embodiment of the present invention. With reference to FIG. 2, and continuing reference to FIG. 1, exposure radiation 110 from illumination system 124 is incident on programmable patterning device 104 from beam splitter 118. Individual pixels of programmable patterning device 104, according to their respective states, either direct radiation along a first optical path back through beam splitter 118 to substrate 114 (FIG. 1) or on a second optical path away from beam splitter 118. The latter radiation is for convenience referenced 240 in the figure. For convenience, pixels that are set to direct light to substrate 114 will be referred to as "on" and those which divert radiation as "off." Diverted radiation 240 can be incident on a beam stop to prevent stray light and to enable a heat load to be dealt with. According to this embodiment of the present invention, diverted beam 240 is directed to a detector 242 and an output 244 of detector 240 is used to determine whether there is any malfunction of programmable patterning device 104.

In its simplest form, detector 242 can be a simple intensity detector. A malfunction is detected if an intensity of deflected beam 240 as a proportion of the incident illumination beam 110 is different than the proportion of pixels of programmable patterning device 104 in the "off" state. Although in this example this arrangement may not identify which pixels are malfunctioning, it can be useful in giving an indication of when maintenance is necessary.

In one example, to enable identification of faulty pixels, a detector with some spatial resolution, such as a charge coupled device (CCD) or CMOS image sensor, can be provided. Ideally the resolution of detector 242 should be equal to or greater than that of programmable patterning device 104 so that a direct detection of malfunctioning pixels can be performed. To do this, a pattern source 246, which supplies the pattern to programmable patterning device 104, also supplies this to a control system 248, which also receives output 244 of detector 242. Control system 248 compares the pattern to the complement of output 244 of detector 242 to identify the malfunctioning pixels. This can be done in a number of mathematically equivalent ways, e.g., by taking the complement of either one of the pattern and output 244 and adding it to the other, or by adding the pattern and output 244 and subtracting the maximum intensity value from each pixel. Prior to the comparison, output 244 can be binarized, if programmable patterning device 104 is two-state, or equalized. Overall or pixel-by-pixel corrections, e.g., for non-uniform detector response, can also be applied.

If the resolution of detector 242 is less than that of programmable patterning device 104, identification of the malfunctioning pixels can be performed by scanning detector 242 through an aerial image of programmable patterning device 104 in deflected beam 240. Alternatively, a reduced image of programmable patterning device 104 can be projected onto detector 242 so that a block of n*m (where n may or may not equal m) pixels of programmable patterning device 104 is projected onto one pixel of detector 242. Malfunctions can then be localized to a block of n*m pixels. By repeating the measurement with a relative displacement of the image and detector 242, which can be effected by moving an element in the optical path or detector 242 itself, further localization and possibly exact identification of malfunctioning pixels can be obtained.

In one example, when the exposure radiation is ultraviolet or deep ultraviolet (DUV) radiation, it can be difficult to provide a suitable detector that is sensitive to the exposure radiation. In that case, a detector sensitive to longer wavelength radiation, e.g., visible light, can be used by providing a luminescent layer over the active surface of the detector. The luminescent layer absorbs the short wavelength radiation and emits longer wavelength radiation which can be detected by the detector without damaging it. In case the intensity of the deflected radiation is too high for the detector, a partially reflective mirror 250, or another filtering element, can be put in the second optical path.

Figure 3:
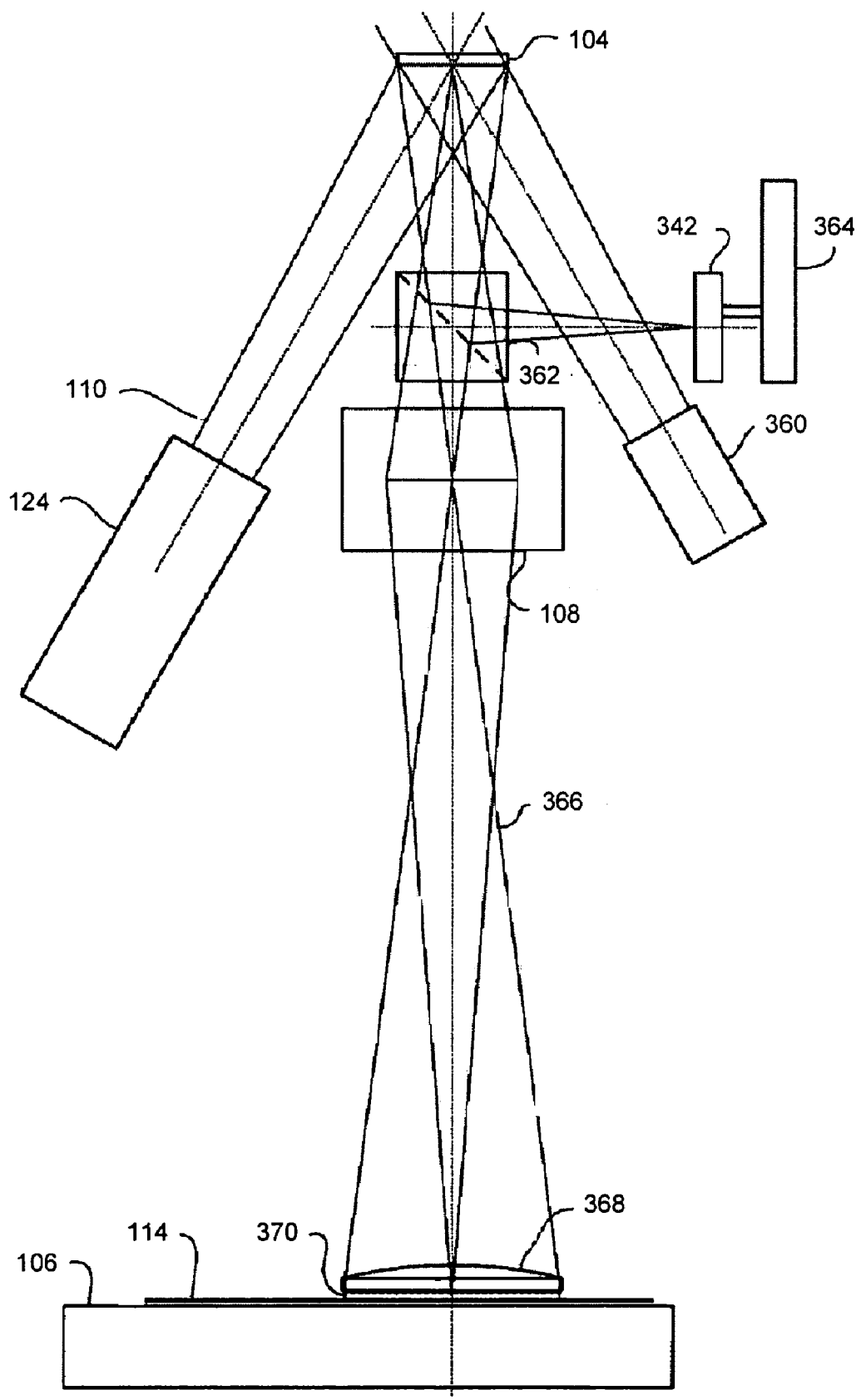

FIG. 3 illustrates an operating principle, according to one embodiment of the present invention. In this embodiment, as well as illumination system 124, which generates the beam of exposure radiation, a second illumination system 360 is provided. Illumination system 124 and second illumination system 360 generate beams of different wavelength (termed "blue" and "red" respectively for convenience, neither need actually be of those colors) that are incident on programmable patterning device 104 from opposite directions. An "on" pixel of programmable patterning device 104 will direct "blue" light to the substrate (via projection system 108), while an "off" pixel will direct red light to substrate 114. The wavelengths of the "blue" and "red" beams are chosen so that the "blue" radiation will expose the resist, but the "red" radiation will not. Some of the "blue" and "red" radiation will be diverted to detector 342 by a beam splitter 362. Alternatively, beam splitter 362 can be oriented so that both "blue" and "red" radiation propagates to substrate 114 and radiation reflected by substrate 114 is diverted to detector 342.

As in the first embodiment shown in FIG. 2, comparison of the image recorded by detector 342 to the desired pattern allows detection of malfunctioning pixels in programmable patterning device 104. If "blue" is seen where "red" is expected, a pixel is stuck "on" whereas if "red" is seen instead of "blue" a pixel is stuck "off." A dark spot can be indicative of a damaged pixel or a pixel stuck in an indeterminate state. With a patterning device capable of multiple grayscale states, the normalized intensity levels of the image detected by detector 342 can be used to detect pixels that are providing the wrong gray level rather than being stuck. As in the first embodiment, detector 342 can have a luminescent layer and the same approaches to use of a detector of lower resolution than programmable patterning device 104 can be used. For example, a positioning system 364 can be used to scan detector 342.

In one example, a patterned beam 366 is directed onto substrate 114 using a field lens 368 and a microlens array 370, which are positioned between projection system 108 and substrate 114.

In one example, a dichroic mirror can be used in place of beam splitter 362 to direct the "red" radiation to detector 342 before it enters the projection system PL. The "red" image seen by detector 342 is then the complement of the desired image, and malfunctioning pixels can be detected in the same way as the first embodiment.

In one example, detection of malfunctioning pixels is performed in parallel with exposure of substrates so that there is no loss of throughput. No time needs to be devoted to the detection of malfunctioning pixels. Identification or localization of malfunctioning pixels can reduce the time required for repair or can allow compensatory measures to be taken that do not stop production. For example, in scanning modes, a small number of defective pixels can be compensated for by other pixels. It can also be possible to decide that a defective pixel is in a non-critical area of the pattern, so that production can continue without repair.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus for projecting a pattern onto a substrate, the apparatus comprising:
   a patterning array of individually controllable elements that pattern a beam by selectively diverting incident radiation between a first optical path leading to a target portion of the substrate and a second optical path not leading to the substrate; and
   a detector sensitive to the radiation provided in the second optical path.

2. The lithographic apparatus of claim 1, further comprising:
   a control system that compares an output of the detector to a complement of a desired pattern to detect any malfunction of the patterning array of individually controllable elements.

3. The lithographic apparatus of claim 2, wherein the pattern is a binary pattern and the complement is a two's complement.

4. The lithographic apparatus of claim 1, wherein the detector is a spatial sensor.

5. The lithographic apparatus of claim 1, wherein the detector is a charged coupled device.

6. The lithographic apparatus of claim 1, wherein the detector is a CMOS image sensor.

7. The lithographic apparatus of claim 1, further comprising:
   a partially reflective mirror in the second optical path between the patterning array of individually controllable elements and the detector.

8. The lithographic apparatus of claim 1, wherein the patterning array is a digital mirror device.

9. The lithographic apparatus of claim 1, wherein the patterning array is a grating light valve.

10. A lithographic apparatus for projecting a pattern onto a substrate, the apparatus comprising:
    a patterning array of individually controllable elements;
    a first illumination system that directs a first beam of radiation onto the patterning array of individually controllable elements, the patterning array of individually controllable elements patterning the first beam with a first pattern;
    a second illumination system that directs a second beam of radiation onto the patterning array of individually controllable elements from a different direction, the patterning array of individually controllable elements patterning the second beam with a second pattern that is a complement of the first pattern;
    a projection system that projects the first beam onto a target portion of the substrate; and
    a detector that receives, and is sensitive to, radiation from the second beam deflected by the patterning array.

11. The lithographic apparatus of claim 10, wherein the detector is positioned to receive both the patterned first beam and the patterned second beam.

12. The lithographic apparatus of claim 11, further comprising:
    a beam splitter between the patterning array of individually controllable elements and the projection system, the beam splitter being arranged to divert a portion of the patterned first beam and of the patterned second beam onto the detector.

13. The lithographic apparatus of claim 10, further comprising:
    a control system that compares an output of detector the to the first pattern to detect any malfunction of the patterning array of individually controllable elements.

14. The lithographic apparatus of claim 10, wherein the detector is a spatial sensor.

15. The lithographic apparatus of claim 10, wherein the detector is a charged coupled device.

16. The lithographic apparatus of claim 10, wherein the detector is a CMOS image sensor.

17. The lithographic apparatus of claim 10, wherein the radiation of the first beam has a shorter wavelength than radiation of the second beam.

18. The lithographic apparatus of claim 10, wherein the patterning array of individually controllable elements is a digital mirror device.

19. The lithographic apparatus of claim 10, wherein the patterning array of individually controllable elements is a grating light valve.

20. A device manufacturing method comprising:
    patterning a beam of radiation with a patterning array of individually controllable elements by selectively diverting incident radiation between a first optical path leading to a target portion of a substrate and a second optical path leading away from the substrate; and
    detecting the diverted incident radiation in the second optical path to detect any malfunction of the patterning array.

21. A device manufacturing method comprising:
    directing first and second beams of radiation onto a patterning array of individually controllable elements that pattern the beams, the beams being directed onto the patterning array of individually controllable elements from different directions, such that they are patterned with complementary patterns;
    projecting the first beam of radiation onto a target portion of a substrate; and
    detecting any malfunction of the patterning array using a detector provided in the path of the second beam.

* * * * *